United States Patent [19]

Tsuyuki et al.

[11] 3,969,747
[45] July 13, 1976

[54] COMPLEMENTARY BIPOLAR TRANSISTORS WITH IIL TYPE COMMON BASE DRIVERS

[75] Inventors: Tadaharu Tsuyuki, Isehara; Hajime Yagi, Tokyo; Toshiro Kobayashi, Atsugi, all of Japan

[73] Assignee: Sony Corporation, Tokyo, Japan

[22] Filed: June 10, 1974

[21] Appl. No.: 477,786

[30] Foreign Application Priority Data
June 13, 1973  Japan.................................. 48-66488

[52] U.S. Cl. ................................. 357/44; 357/35; 357/38; 357/46; 357/48; 357/50
[51] Int. Cl.² ........................................... H01L 27/04
[58] Field of Search .................... 357/38, 44, 48, 46

[56] References Cited
UNITED STATES PATENTS

| | | | |
|---|---|---|---|
| 3,189,783 | 6/1965 | van Berkum..................... | 307/252 D |
| 3,439,237 | 4/1969 | Sylvan................................ | 357/38 |
| 3,564,443 | 2/1971 | Nagata................................ | 357/44 |
| 3,575,646 | 4/1971 | Karcher.............................. | 357/38 |
| 3,643,235 | 2/1972 | Berger et al. ..................... | 357/44 |
| 3,676,714 | 7/1972 | Wensink et al. .................. | 357/44 |
| 3,729,719 | 4/1973 | Wiedmann........................ | 357/44 |
| 3,736,477 | 5/1973 | Berger et al. ..................... | 357/44 |
| 3,898,483 | 8/1975 | Sander et al...................... | 307/238 |

Primary Examiner—William D. Larkins
Attorney, Agent, or Firm—Hill, Gross, Simpson, Van Santen, Steadman, Chiara & Simpson

[57] ABSTRACT

An integrated circuit including an NPN transistor and a compound PNP transistor. The PNP transistor is of the form of a conventional vertical NPN transistor, in common base configuration, supplying base current to a lateral PNP transistor. The emitter of the vertical NPN is disposed in the emitter of the lateral PNP; the base and collector of the vertical NPN are the emitter and base regions, respectively, of the lateral PNP. The separate NPN transistor may be of conventional configuration, or may also be compound, with a lateral PNP supplying base current to an inverse vertical NPN. All conductivity types may be reversed from those listed, also.

6 Claims, 7 Drawing Figures

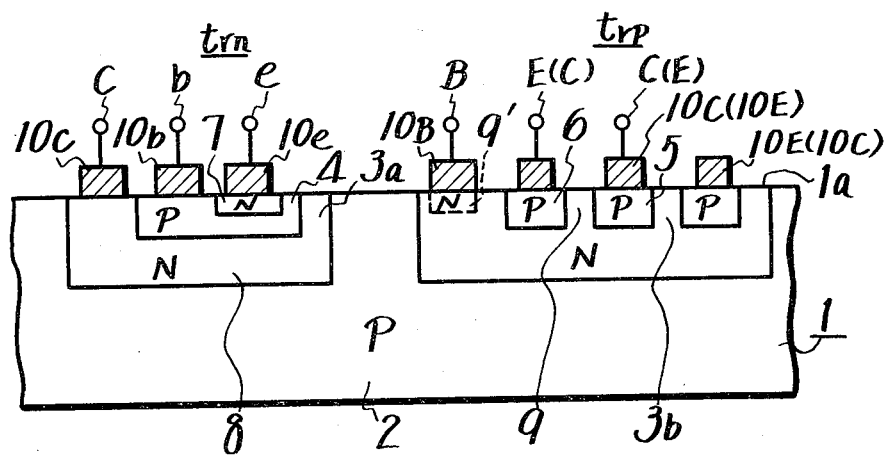
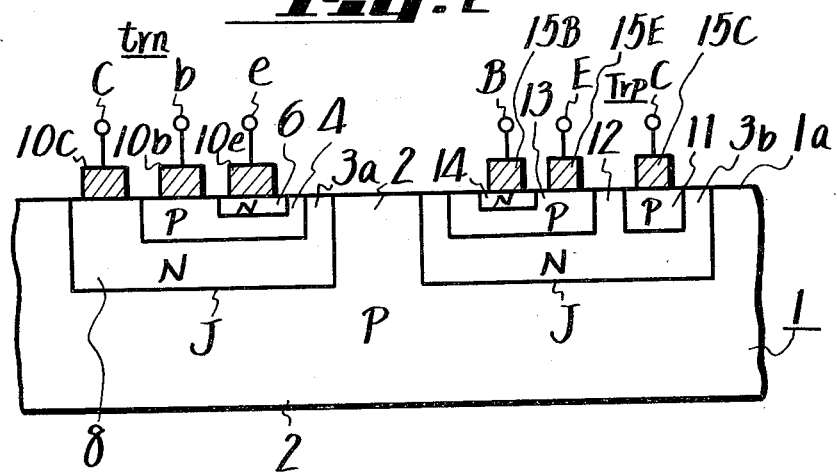
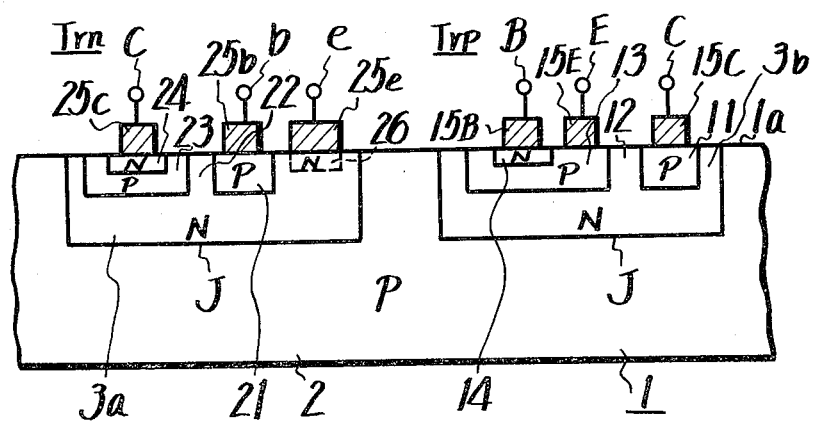

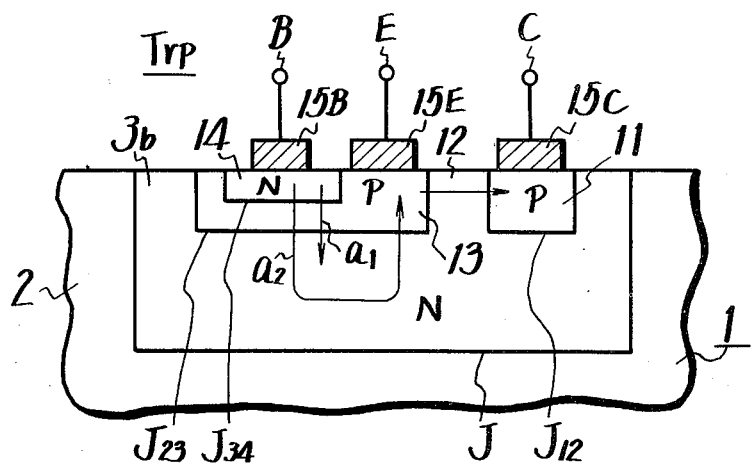
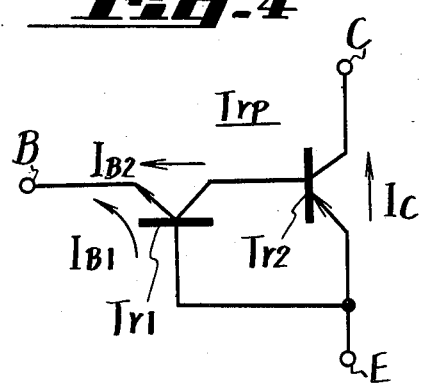
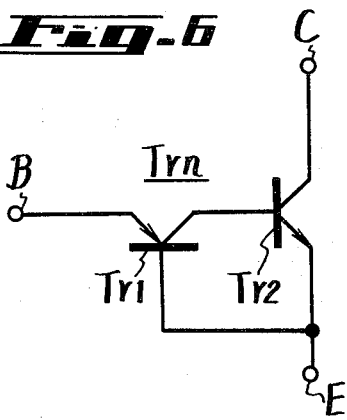
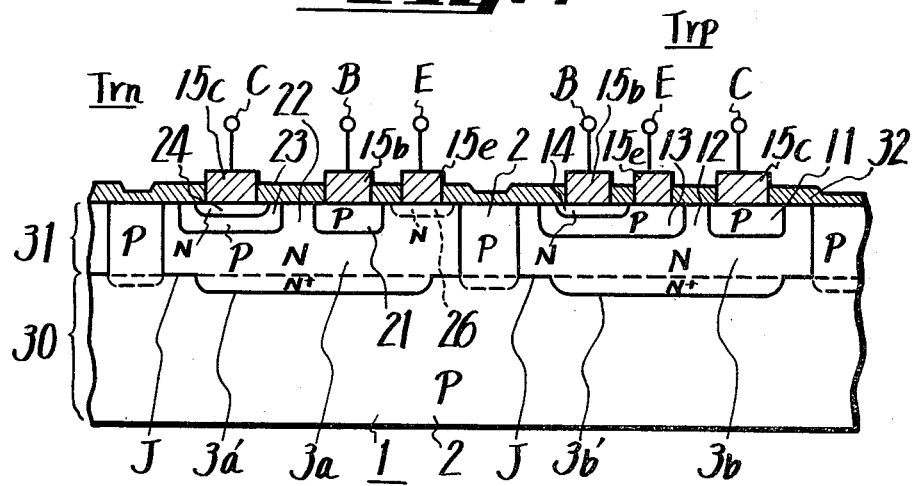

3,969,747

COMPLEMENTARY BIPOLAR TRANSISTORS WITH IIL TYPE COMMON BASE DRIVERS

BACKGROUND OF THE INVENTION

1. Field of the Invention

The present invention relates to a semiconductor device suitable for use in a semiconductor integrated circuit.

2. Description of the Prior Art

There has hitherto been proposed a semiconductor integrated circuit in which a PNP transistor and an NPN transistor having different conductivity types are constructed in a common semiconductor substrate. A transistor having one conductivity type is constructed in the form of a so-called vertical transistor having a normal vertical arrangement while a transistor having the other conductivity type is constructed in the form of a so-called lateral transistor and hence both the PNP and NPN transistors are formed by the same process for simplification of manufacture. This prior art integrated circuit will now be described with reference to FIG. 1.

In one major surface 1a of a semiconductor substrate 1 there are provided N-type island regions 3a and 3b which are separated from each other by an isolation region 2 of, for example, P-type. A P-type region 4 is selectively diffused in the island region 3a and at the same time a P-type region 5 and an annular P-type region 6 surrounding the former are formed in the other island region 3b with the required space maintained therebetween. Then, on the P-type region 4 in the island region 3a there is selectively diffused an N-type region 7 and also in the other island region 3b there is diffused by the same process an N-type region 9' at a side opposite to the region 5 with the region 6 being interposed therebetween. Thus, a vertical NPN transistor trn is constructed with the P-type region 4 and N-type region 7 in the island region 3a which serve as base and emitter regions, respectively and an N-type portion 8 of the island region 3a which serves as a collector region. Further, in the other island region 3b, the P-type regions 5 and 6 are used as a collector (or emitter) region and an emitter (or collector) region, respectively, while an N-type portion 9 between both regions 5 and 6 is used as a base region and the region 9' is used as a low-resistance region for connecting a base electrode, thus constructing a lateral PNP transistor trp wherein the respective regions are disposed in a lateral direction. References 10e, 10b and 10c designate electrodes for connecting an emitter terminal e, a base terminal b and a collector terminal c, respectively, to the NPN transistor trn, and 10E, 10B and 10C electrodes for connecting an emitter terminal E, a base terminal B and a collector terminal C, respectively, to the PNP transistor trp.

In the case when the transistor trp is fabricated in a lateral manner, the respective regions of both transistors can be formed by the same process and the fabrication is simple. In this connection, when both transistors are respectively formed in a vertical manner, the island region 3b has also provided therein regions (though not shown) corresponding to the regions 4 and 7 in the island region 3a. These regions are respectively used as a P-type collector region and an N-type base region and a P-type emitter region must be formed by, for example, diffusion on this base region through another process. Therefore, at least one additional process step is required. An increase in the number of selective diffusion process steps increase production cost.

However, in the transistor trp formed by lateral construction it is desired to provide a space between the collector and emitter regions 5 and 6 as small as possible in order to increase its current-amplification factor $h_{FE}$. To this end, a portion for connecting the base electrode 10B should be located, for example, at a position on the side opposite to the region 5 with the region 6 being interposed therebetween. As a result, the lateral transistor trp has a base spreading resistance which becomes too great.

SUMMARY OF THE INVENTION

Accordingly, a main object of this invention is to provide a semiconductor device suitable for use in a semiconductor integrated circuit.

Another object of this invention is to provide a semiconductor device free from the above mentioned defects in a lateral transistor.

A further object of this invention is to provide a semiconductor device wherein the number of steps in the fabricating process is not increased.

A still further object of this invention is to provide a semiconductor device wherein the base spreading resistance is small.

A further another object of this invention is to provide a semiconductor device having the same characteristics as those of a bipolar transistor.

The other objects, features and advantages of the present invention will be apparent from the following description taken in conjunction with the accompanying drawing.

BRIEF DESCRIPTION OF THE DRAWING

FIG. 1 is an enlarged cross-sectional view showing a prior art device,

FIG. 2 is an enlarged cross-sectional view showing an example of the device of this invention, FIG. 3 is a view used for explaining the operation of the device shown in FIG. 2, FIG. 4 is a view showing an equivalent circuit of the device shown in FIG. 3, FIG. 5 is an enlarged cross-sectional view showing another example of the device of this invention, FIG. 6 is a view showing an equivalent circuit of the device shown in FIG. 5, and FIG. 7 is an enlarged cross-sectional view used for explaining an example of fabricating the device of this invention.

DESCRIPTION OF THE PREFERRED EMBODIMENT

A description will hereinafter be given of an embodiment of this invention with reference to FIG. 2. This embodiment is of a case wherein transistors of conductivity types different from each other are formed in a common semiconductor substrate 1. In the case of the illustrated example, the substrate 1 has provided therein, facing its one major surface 1a, the island regions 3a and 3b of N-type surrounded and separated from each other by the isolation region 2 of the other conductivity type, for example, P-type in the same manner as described in FIG. 1. PN-junctions between these island regions 3a, 3b and the region 2 are impressed with a reverse bias to isolate them from each other.

The island region 3a has formed therein the vertical NPN transistor trn according to the same construction as described in FIG. 1. In FIG. 2, elements corresponding to those of FIG. 1 are expressed by the same references with their repeated description being omitted.

Then, the other island region 3b has formed therein a device of this invention. That is, facing the surface 1a of the substrate 1 there are provided a first region 11 of a first conductivity type or P-type in this example, a second region 12 of a second conductivity type or N-type, a third region 13 of the first conductivity type or P-type, and a fourth region 14 of the second conductivity type or N-type. The second region 12 is formed by the island region 3b itself. The fourth region 14 is arranged to be surrounded by the third region 13. The first and third regions 11 and 13 can be simultaneously formed with a required space being therebetween by the same diffusion process as that of the base region 4 of the NPN transistor trn. Further, the fourth region 14 is formed by selective diffusion in to the third region 13 by the same process step which forms the emitter region 6 of the NPN transistor trn.

On the surface 1a, a ohmic collector electrode 15C is deposited on the first region 11, an ohmic emitter electrode 15E is deposited on the third region 13 and an ohmic, base electrode 15B is deposited on the fourth region 14 thereby to provide a collector terminal C, an emitter terminal E and a base terminal B.

With such a construction as described above, a negative voltage is applied to the first region 11 to provide a reverse bias to PN-junction $J_{12}$ between the first region 11 and the second region 12 and also to feed a signal between the third and fourth regions. Thus, there is constructed a PNP transistor Trp in which the third region 13 of P-type is operated as the emitter region, the fourth region 14 as the base region and the first region 11 as the collector region. Its operation will now be described with reference to FIG. 3. The operation will be better understood by considering the transistor Trp as being separated into two transistor portions. In other words, it is considered that, as shown in FIG. 4, that the transistor Trp consists of an NPN transistor $Tr_1$ with the fourth region 14, the third region 13 and the second region 12 serving as emitter, base and collector regions and a PNP transistor $Tr_2$ with the third region 13, the second region 12 and the first region 11 serving as emitter, base and collector regions. With the above construction, if a forward voltage is applied between the terminals E and B, PN-junction $J_{34}$ between the fourth region 14 and the third region 13 becomes forward biased and hence electrons are injected from the fourth region 14 into the third region 13 through the junction $J_{34}$ as shown in FIG. 3 by an arrow $a_1$. That is, a current $I_{B1}$ flows through the baseemitter of the transistor $Tr_1$ to put it in a conductive condition, so that minority carriers or electrons injected from the emitter region 14 of the transistor $Tr_1$ reach the second region 12 of N-type as shown in FIG. 3 by an arrow $a_2$ and are absorbed into this region 12. In this region 12, electrons are majority carriers and hence the lifetime is long. On the other hand, the PN-junction $J_{12}$ between the second region 12 and the first region 11 and the PN-junction J between the region 12 and the isolation region 2 are respectively in a reverse biased condition, so that the electrons reaching the region 12 are returned to the third region 13 which makes it easy for the above electrons to flow and hence a current $I_{B2}$ flows therethrough. The current $I_{B2}$ becomes the base current of the transistor $Tr_2$ to put it in a conductive condition and hence majority carriers in the emitter region or third region 13 of the transistor $Tr_2$ flow through the second region 12 which serves as the base region of the transistor $Tr_2$ into the first region 11 which serves as the collector region of the transistor $Tr_2$. That is, the collector current $I_c$ of the transistor $Tr_2$ flows therethrough. Thus, the transistor Trp operates in the same manner as a PNP transistor which has the third region 13 as its emitter, the fourth region 14 as its base and the first region 11 as its collector.

In the transistor Trp having the above described construction, the first and third regions 11 and 13 can be formed by the same diffusion process step as that in which the base region 4 of the NPN transistor trn is formed and the fourth region 14 can be formed by the same diffusion process step in which the emitter region 6 of the NPN transistor is formed, so that the number of manufacturing process steps can be reduced in the same way as in the prior art PNP transistor having the lateral construction shown in FIG. 1. Besides, in the transistor Trp according to this construction, since the region 14 deposited with the base electrode 15B is formed on the third region 13 which serves as emitter region, the distance between the region 14 and the second region 12 which serves as base region, that is, between the base electrode 15B and the base operative region 12 can be greatly reduced. Accordingly, its base spreading resistance can be greatly reduced.

In the above described construction, when the impurity concentration of the region 13 is to be low, the diffusion distance of minority carriers into region 13 can be made great, so that the transport efficiency of minority carriers in this region 13 can be enhanced and the current $I_{B2}$ can be made large as compared with the current $I_{B1}$ which may become ineffective, with the result that a transistor of high $h_{FE}$ can be obtained.

The example shown in FIG. 2 is of a case where the prior art vertical construction is applied to the NPN transistor, but this NPN transistor can also be applied with the lateral construction according to this invention. One example of this case will be described in connection with FIG. 5. In this case, the same construction as described in FIG. 2 can be employed in the PNP transistor and hence elements corresponding to those of FIG. 2 are expressed by the same references and the description is omitted. In this example, the island region 3a has also provided therein a second region 22 formed by this island region 3a itself, and first and third regions 21 and 23 both of P-type formed in the same manner and at the same time as the formation of the first and third regions 11 and 13 both of P-type in the transistor Trp. Further, on the third region 23 there is formed a fourth region 24 of N-type at the same time as the formation of the fourth region 14 of N-type in the transistor Trp. In addition, the second region 22 has formed therein a low-resistance region 26 to be connected to an electrode at the same time as the formation of the regions 14 and 24.

In the case, for the construction of an NPN transistor Trn with the fourth region 24 as its collector, the second region 22 as its emitter and the first region 21 as its base, at the surface 1a there are deposited an ohmic collector electrode 25c on the fourth region 24, an emitter electrode 25e on the low-resistance region 26 of the second region 22, and a base electrode 25b on the first region 21, and the collector, base and emitter terminals c, b and e are connected thereto. The equivalent circuit of this NPN transistor Trn is as shown in FIG. 6, which is composed of a PNP transistor, $Tr_1$ with the first region 21 of P-type as its emitter, the second region 22 of N-type as its base and the third region 23 of P-type as its collector, and an NPN transistor $Tr_2$ with the second region 22 of N-type as its emitter, the third region 23 of P-type as its base and the fourth region 24 of N-type as its collector. Thus, the operation of this NPN transistor Trn will be the same as that of a transistor Trp wherein the polarity is reversed which is described relative to FIGS. 3 and 4 and hence normal NPN bipolar transistor characteristics can be obtained.

In the case where the transistor Trn is used, there is an advantage such that stray capacitance between the collector region and isolation region 2 can be decreased as compared with the case wherein the normal vertical-type NPN transistor trn is used as described in FIG. 2.

In order to obtain the above mentioned integrated circuit, as shown in FIG. 7 there is provided a P-type substrate 30 which will serve as the isolation region 2 and at one surface thereof there are selectively diffused buried regions $3a'$ and $3b'$ of low resistance on which an N-type semiconductor layer 31 is epitaxially grown to construct a wafer 1. Then, P-type impurity is formed crossing this semiconductor layer 31 from the top thereof to form the isolation region 2 and thus the island regions $3a$ and $3b$ separated by this isolation region 2 are formed. Thus, the transistors Trn and Trp can be respectively formed in these island regions $3a$ and $3b$ as mentioned above. Reference numeral 32 indicates an insulating layer such as $SiO_2$ formed on the wafer surface.

The respective examples as illustrated describe the case wherein the isolation region 2, and the first and third regions 11, 21 and 13, 23 are of P-type while the island regions $3a$ and $3b$ and the fourth regions 14 and 24 are of N-type, but the respective regions can also be of opposite conductivity types to those of the illustrated examples.

Further, in the above described examples, there is applied a separation method using a PN-junction such that the island regions $3a$ and $3b$ are separated by the semiconductor isolation region 2. However, it will be noticed that one portion is separated by a PN-junction while the other portion is separated by an insulating material.

While the principles of the invention have been described above in connection with specific embodiments, and particular modifications thereof, it is to be clearly understood that this description is made only by way of example and not as a limitation on the scope of invention.

We claim as our invention:

1. A semiconductor device including a pair of complementary transistors comprising a planar substrate of a first conductivity type, first and second regions of opposite conductivity type formed in said substrate from a first surface and separated laterally from each other, third and fourth regions of said first conductivity type formed in said first region, fifth and sixth regions of said first conductivity type formed in said second region, a seventh region of opposite conductivity type formed in said third region, an eighth region of opposite conductivity type formed in said fifth region, a first collector electrode connected to said seventh region, a first base electrode connected to said fourth region, a first emitter electrode connected to said first region, a second base electrode connected to said eighth region, a second emitter electrode connected to said fifth region, a second collector electrode connected to said sixth region, and means for applying a bias potential to said second emitter electrode and to said second collector electrode of such polarity to forward bias the fifth region relative to said second region, and to reverse bias said second region relative to said sixth region, and means for applying a bias potential to said second base electrode and to said second collector of such polarity to forward bias said eighth region relative to said fifth region.

2. A semiconductor device according to claim 1 including a first low resistance region formed between said first emitter electrode and said first region.

3. A semiconductor device according to claim 2 including second and third low resistance buried regions between said substrate and said first and second regions.

4. A semiconductor device according to claim 3 including an insulating layer formed on said first surface of said substrate.

5. A semiconductor device according to claim 4 wherein said insulating layer is made of silicon dioxide.

6. A semiconductor device including a pair of complementary transistors comprising, a planar substrate of a first conductivity type, first and second regions of opposite conductivity type formed in said substrate from a first surface and separated laterally from each other, third, fourth and fifth regions of first conductivity type formed in said first and second regions with said third region in said first region and said fourth and fifth regions in said second region, sixth and seventh regions of opposite conductivity type respectively formed in said third and fourth regions, a first collector electrode connected to said first region, a first base electrode connected to said third region, a first emitter electrode connected to said sixth region, a second base electrode connected to said seventh region, a second emitter electrode connected to said fourth region, a second collector electrode connected to said fifth region, first biasing means for applying a bias potential to said second emitter electrode and said second base electrode of such polarity to forward bias said fourth region relative to said seventh region, and second biasing means for applying a bias potential to said second emitter electrode and said second collector electrode of such a polarity as to forward bias said fourth region relative to said second region, and to reverse bias said second region relative to said fifth region.

* * * * *